United States Patent
He et al.

(10) Patent No.: US 9,887,238 B1
(45) Date of Patent: Feb. 6, 2018

(54) SEMICONDUCTOR DEVICE AND METHOD FOR FABRICATING THE SAME

(71) Applicant: UNITED MICROELECTRONICS CORP., Hsin-Chu (TW)

(72) Inventors: Wanxun He, Singapore (SG); Su Xing, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/413,349

(22) Filed: Jan. 23, 2017

(30) Foreign Application Priority Data

Dec. 29, 2016 (CN) .......................... 2016 1 1242454

(51) Int. Cl.
*H01L 45/00* (2006.01)
*H01L 21/8234* (2006.01)
*H01L 27/24* (2006.01)
*H01L 29/786* (2006.01)

(52) U.S. Cl.
CPC .... *H01L 27/2436* (2013.01); *H01L 21/82345* (2013.01); *H01L 45/065* (2013.01); *H01L 45/122* (2013.01); *H01L 45/126* (2013.01); *H01L 45/144* (2013.01); *H01L 45/1608* (2013.01); *H01L 29/7869* (2013.01)

(58) Field of Classification Search
CPC ............. H01L 27/2436; H01L 29/7869; H01L 21/82345; H01L 21/823842; H01L 2924/13985; H01L 2924/13092; H01L 45/065; H01L 45/06; H01L 45/122; H01L 45/14; H01L 45/126; H01L 45/16; H01L 45/144; H01L 45/1608; H01L 45/141
See application file for complete search history.

(56) References Cited

U.S. PATENT DOCUMENTS

| | | | | |
|---|---|---|---|---|
| 9,722,093 B1* | 8/2017 | Xing | ................... | H01L 29/7869 |
| 2003/0222292 A1* | 12/2003 | Joo | ...................... | H01L 27/2436 257/296 |
| 2008/0099827 A1* | 5/2008 | Kreupl | ............... | G11C 13/0004 257/324 |
| 2008/0121863 A1* | 5/2008 | Chen | .................. | G11C 13/0004 257/4 |
| 2015/0357429 A1* | 12/2015 | Dubourdieu | ........ | H01L 29/4966 257/295 |

OTHER PUBLICATIONS

H.-S. Philip Wong, Title: Phase Change Memory; vol. 98, No. 12, Dec. 2010, Proceedings of the IEEE.
Su Xing, Title of Invention: Oxide Semiconductor Transistor and Manufacturing Method Thereof, U.S. Appl. No. 15/253,896, filed Sep. 1, 2016.

* cited by examiner

*Primary Examiner* — Galina Yushina
(74) *Attorney, Agent, or Firm* — Winston Hsu

(57) ABSTRACT

A semiconductor device and a method for fabricating the semiconductor device have been provided. The method for fabricating a semiconductor device includes the steps of: forming a channel layer on a substrate; forming a gate dielectric layer on the channel layer; forming a source layer and a drain layer adjacent two sides of the gate dielectric layer; forming a bottom gate on the gate dielectric layer; forming a phase change layer on the bottom gate; and forming a top gate on the phase change layer.

9 Claims, 4 Drawing Sheets

US 9,887,238 B1

SEMICONDUCTOR DEVICE AND METHOD FOR FABRICATING THE SAME

BACKGROUND OF THE INVENTION

1. Field of the Invention

The invention relates to a semiconductor device and a method for fabricating the semiconductor device, and more particularly to an oxide-semiconductor (OS) transistor and fabrication method thereof.

2. Description of the Prior Art

Attention has been focused on a technique for formation of a transistor using a semiconductor thin film formed over a substrate having an insulating surface. The transistor is used in a wide range of electronic devices such as an integrated circuit (IC) and an image display device (display device). A silicon-based semiconductor material is widely known as a material for a semiconductor thin film applicable to a transistor, and within which, oxide semiconductor containing indium (In), gallium (Ga), and zinc (Zn) has been attracting attention.

A transistor including an oxide semiconductor film is known to have an extremely low leakage current in an off state. Nevertheless, current architecture of a so-called oxide-semiconductor transistor is still insufficient in providing multiple Vt options and allowing flexible device $I_{on}/T_{off}$. Hence, how to improve the fabrication as well as structure of current oxide-semiconductor device has become an important task in this field.

SUMMARY OF THE INVENTION

According to an embodiment of the present invention, a method for fabricating a semiconductor device includes the steps of: forming a channel layer on a substrate; forming a gate dielectric layer on the channel layer; forming a source layer and a drain layer adjacent two sides of the gate dielectric layer; forming a bottom gate on the gate dielectric layer; forming a phase change layer on the bottom gate; and forming a top gate on the phase change layer.

According to another aspect of the present invention, a semiconductor device includes: a channel layer on a substrate; a bottom gate on the channel layer; a source layer and a drain layer adjacent to two sides of the bottom gate; a phase change layer on the bottom gate; and a top gate on the phase change layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
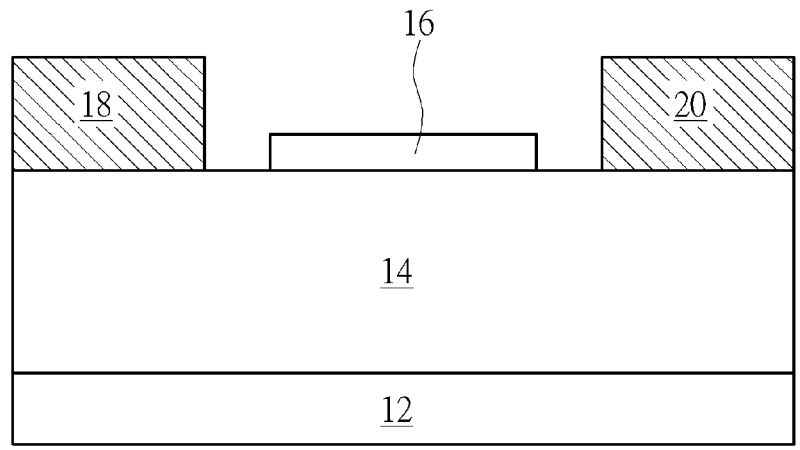
FIGS. 1-6, FIGS. 1-6 illustrate a method for fabricating a semiconductor device according to a preferred embodiment of the present invention.

Referring to FIGS. 1-6, FIGS. 1-6 illustrate a method for fabricating a semiconductor device according to a preferred embodiment of the present invention. As shown in FIG. 1, a substrate 12 is first provided, and at least an insulating layer (not shown) including silicon oxide could be disposed on the substrate 12. The substrate 12 could be a semiconductor substrate including but not limited to for example a silicon substrate, an epitaxial substrate, silicon carbide (SiC) substrate, or a silicon-on-insulator (SOI) substrate. Next, a channel layer 14 made of oxide semiconductor is formed on top of the insulating atop the substrate 12. In this embodiment, channel layer 14 is selected from the group consisting of indium gallium zinc oxide (IGZO), indium aluminum zinc oxide, indium tin zinc oxide, indium aluminum gallium zinc oxide, indium tin aluminum zinc oxide, indium tin hafnium zinc oxide, and indium hafnium aluminum zinc oxide.

Next, agate dielectric layer 16 is formed on the channel layer 14, and a photo-etching process is conducted to remove part of the gate dielectric layer 16 to form a patterned gate dielectric layer 16 on the central portion of the channel layer 14. In this embodiment, the gate dielectric layer 16 could be made of dielectric material including but not limited to for example silicon oxide, silicon nitride, or high dielectric constant (high-k) material.

According to an embodiment of the present invention, the high-k dielectric layer is preferably selected from dielectric materials having dielectric constant (k value) larger than 4. For instance, the high-k dielectric layer may be selected from hafnium oxide ($HfO_2$), hafnium silicon oxide (Hf-$SiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Next, a conductive layer (not shown) is deposited on the channel layer 14 to cover the gate dielectric layer 16 entirely through chemical vapor deposition (such as plasma-enhanced chemical vapor deposition) or physical vapor deposition (such as ion sputtering). In this embodiment, the conductive layer could be made of material including but not limited to for example Al, Cr, Cu, Ta, Mo, W, or combination thereof. Next, a pattern transfer is conducted by forming a patterned resist (not shown) on the conductive layer, and an etching process is conducted to remove part of the conductive layer not covered by the patterned resist to form a source electrode layer 18 and a drain electrode layer 20 adjacent to two sides of the gate dielectric layer 16 on the channel layer 14.

Figure 2:
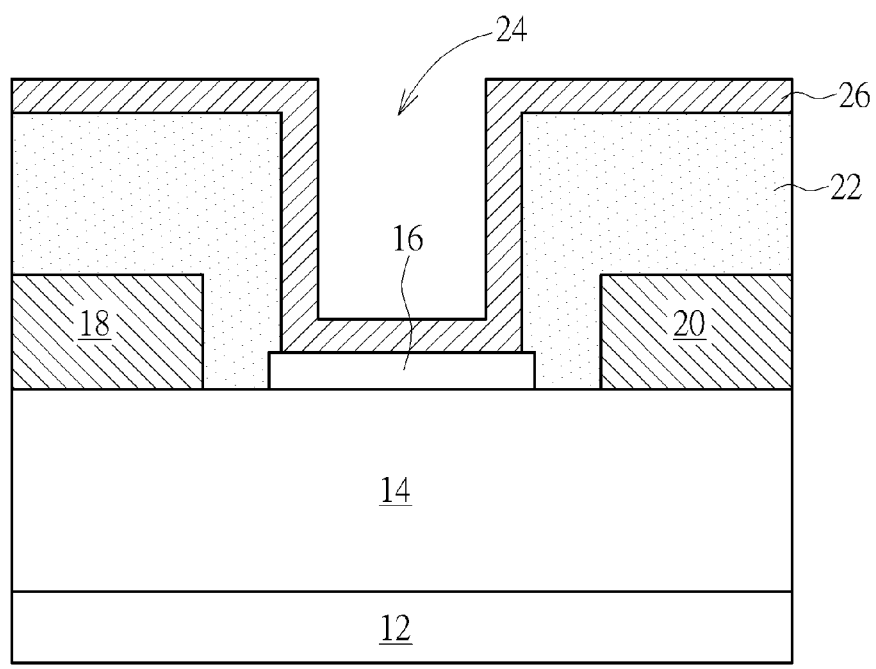

Next, as shown in FIG. 2, a first dielectric layer 22 is formed on the source layer 18, drain layer 20, and gate dielectric layer 16, and a photo-etching process is conducted by forming a patterned mask (not shown) on the first dielectric layer 22, and using an etching process to remove part of the first dielectric layer 22 to form a first recess 24 exposing part of the surface of the gate dielectric layer 16. Next, a work function layer 26 is formed on the top surface of the first dielectric layer 22 and sidewalls of the first recess 24.

According to an embodiment of the present invention, the work function layer 26 could include material having a work function ranging between 3.9 eV and 4.3 eV, which may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but not limited thereto. Moreover, the work function layer 26 could also include material having a work function ranging between 4.8 eV and 5.2 eV, which may include titanium nitride (TiN), tantalum nitride (TaN), tantalum carbide (TaC), but not limited thereto.

Figure 3:
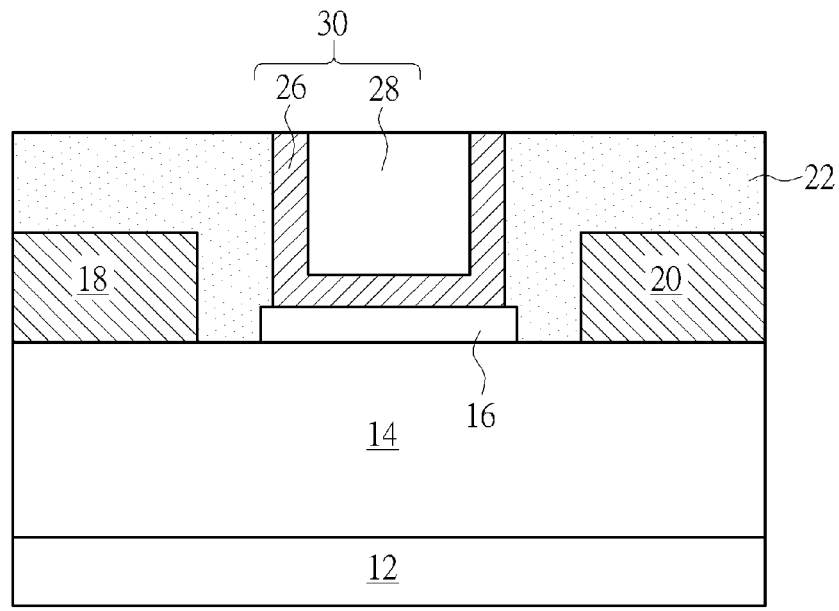

Next, as shown in FIG. 3, a gate electrode 28 is formed on the work function layer 26. The formation of the gate electrode 28 could be accomplished by fully depositing another conductive layer (not shown) on the work function layer 26, and a planarizing process, such as chemical mechanical polishing (CMP) process is conducted to remove part of the conductive layer, part of the work function layer 26, and even part of the first dielectric layer 22 so that the top surfaces of the remaining conductive layer and work function layer 26 are coplanar. Preferably, the remaining conductive layer becomes a gate electrode 28 while the work function layer 26 and gate electrode 28 could together constitute a bottom gate 30. In this embodiment, the gate electrode 28 and the source layer 18 and/or drain layer 20 could be made of same material or different material, in which the gate electrode 28 could be made of material including but not limited to for example Al, Cr, Cu, Ta, Mo, W, or combination thereof.

Figure 4:
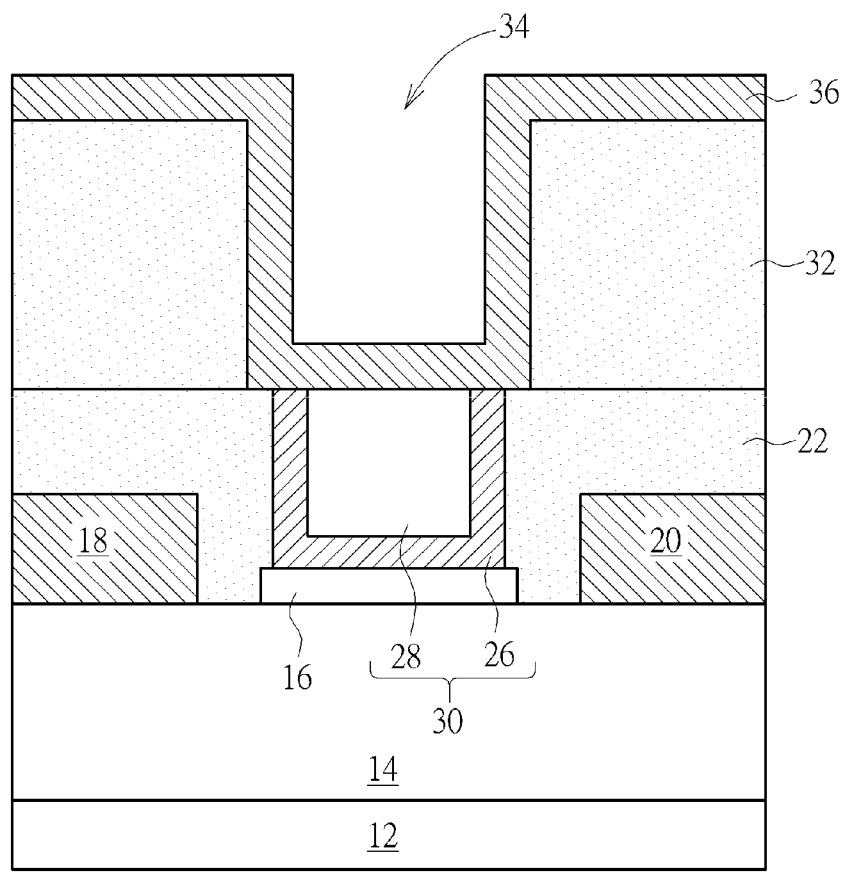

Next, as shown in FIG. 4, a second dielectric layer 32 is formed on the first dielectric layer 22, and a photo-etching process is conducted by forming a patterned mask on the second dielectric layer 32, and using an etching process to remove part of the second dielectric layer 32 for forming a second recess 34 in the second dielectric layer 32 exposing the surfaces of the gate electrode 28 and work function layer 26. Next, a first gate layer 36 is formed on the top surface of the second dielectric layer 32 and the sidewalls of the second recess 34 while contacting the gate electrode 28 and work function layer 26. The first gate layer 36 and the gate electrode 28 could be made of same material or different material, in which the first gate layer 36 could be made of material including but not limited to for example Al, Cr, Cu, Ta, Mo, W, or combination thereof.

Figure 5:
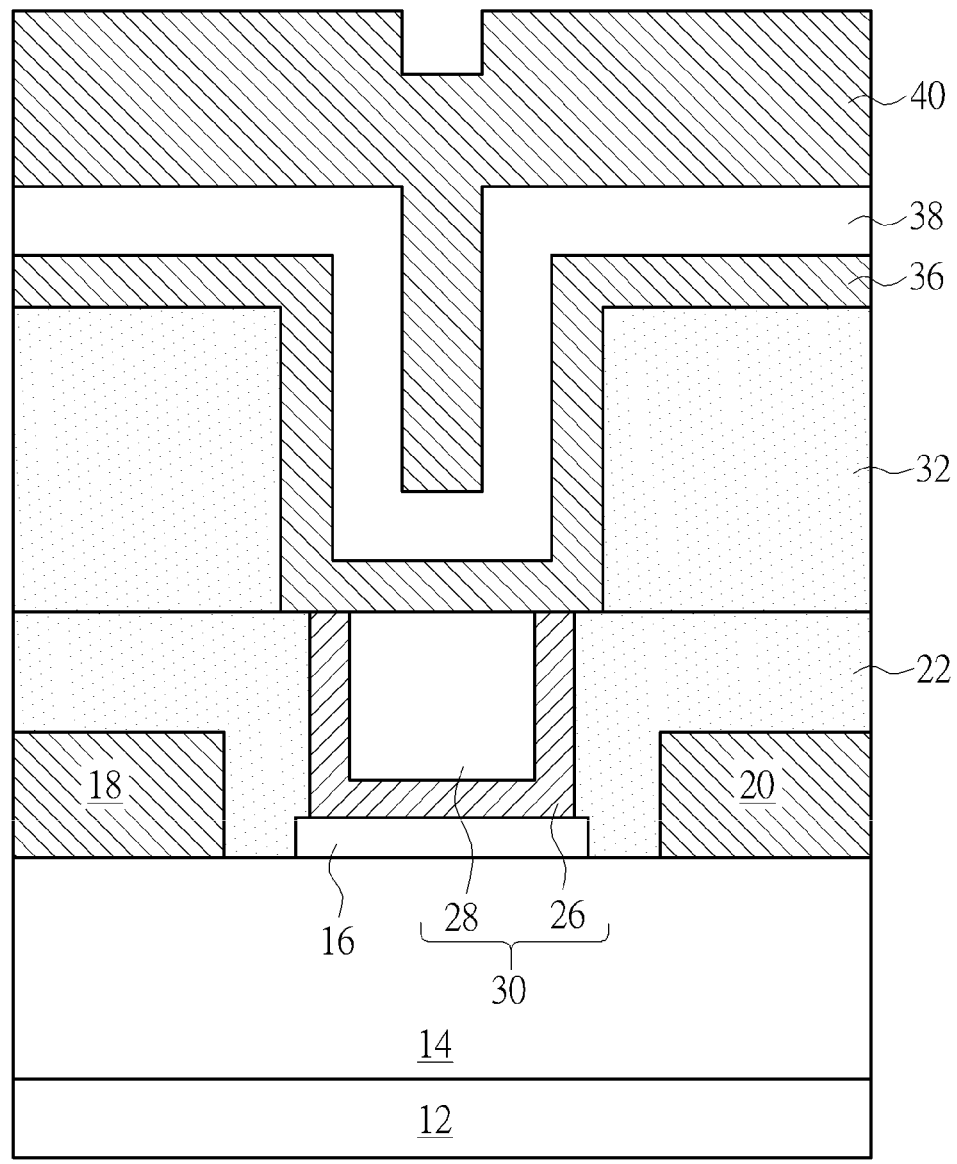

Next, as shown in FIG. 5, a phase change layer 38 and a second gate layer 40 are sequentially formed on the first gate layer 36 and filling the second recess 34 completely. In this embodiment, the second gate layer 40 and the gate electrode 28 and/or the first gate layer 36 could be made of same material or different material, in which the second gate layer 40 could be made of material including but not limited to for example Al, Cr, Cu, Ta, Mo, W, or combination thereof. The phase change layer 38 of this embodiment preferably includes germanium antimony telluride (GST) or germanium telluride (GeTe). It should be noted that the phase change layer 38 of this embodiment is preferably made of micro/nano material having phase changing characteristics so that the property of the material could be altered by applying different voltages. For instance, the phase change layer 38 could be changed from crystalline state to amorphous state or from amorphous state to crystalline state depending on the voltage applied, thereby providing adjustment at low resistance as well as choices for multi-Vt environment.

Figure 6:
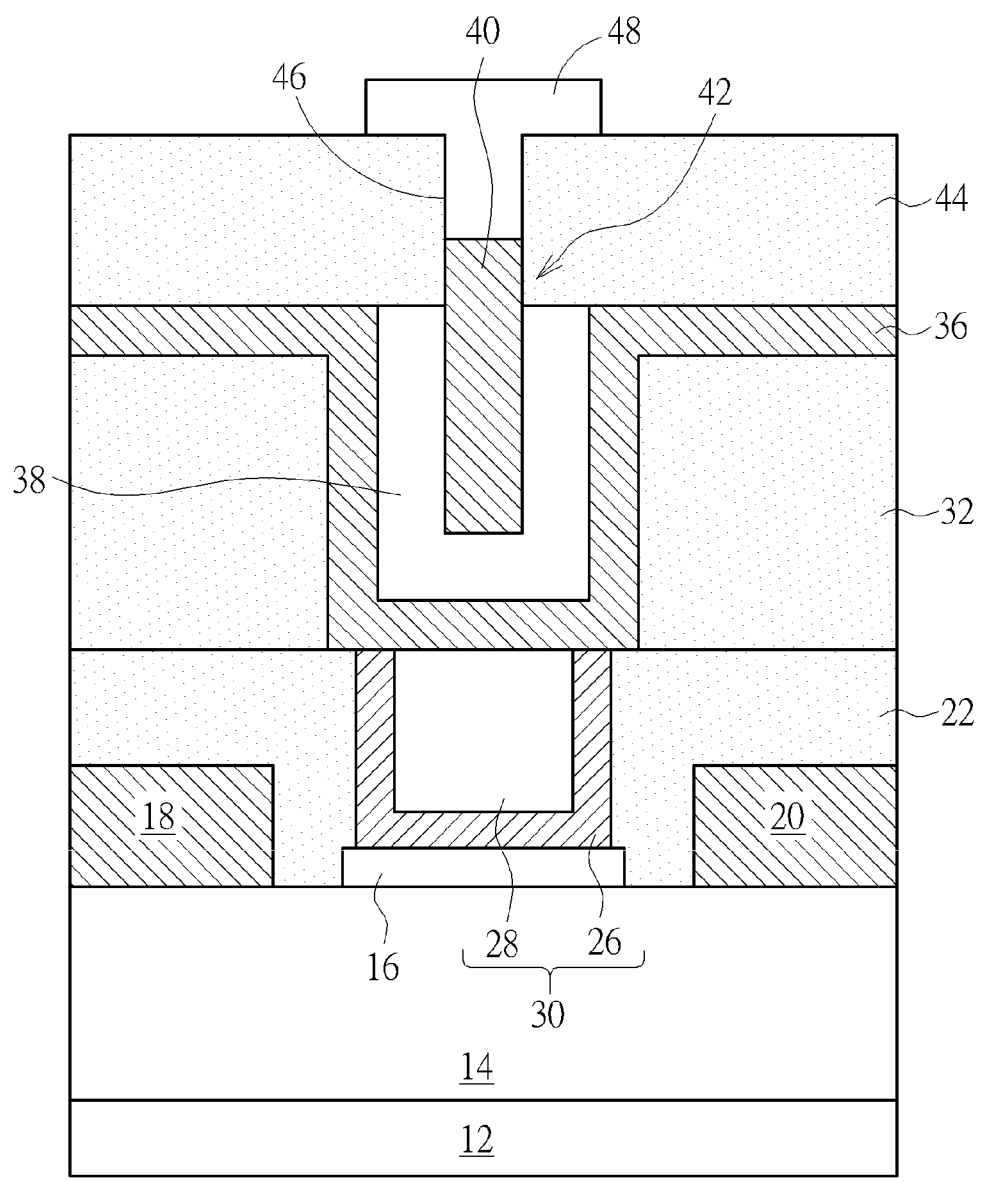

Next, as shown in FIG. 6, a planarizing process, such as CMP is conducted to remove part of the second gate layer 40 and stop on the phase change layer 38 so that the top surface of the remaining second gate layer 40 is even with the top surface of the phase change layer 38. Next, an etching process is conducted to remove part of the phase change layer 38 without removing any of the second gate layer 40 to expose the first gate layer 36 underneath so that the top surface of the remaining phase change layer 38 is even with the top surface of the first gate layer 36 and lower than the top surface of the second gate layer 40. At this stage, the top surface of the remaining second gate layer 40 is preferably protruding or slightly higher than the top surface of phase change layer 38 on adjacent two sides and the protruding second gate layer 40 now becomes a top gate 42.

Next, a third dielectric layer 44 is formed on the first gate layer 36, the phase change layer 38, and the top gate 42, and a photo-etching process is conducted by first forming a patterned mask (not shown) on the third dielectric layer 44 and then using an etching process to remove part of the third dielectric layer 44 for forming a third recess 46 exposing the surface of the top gate 42. Next, a conductive plug 48 could be formed to electrically connect or contacting the top gate 42 directly. The formation of the conductive plug 48 could be accomplished by forming a conductive layer on the third dielectric layer 44 and filling the third recess 46 completely, and then using an etching process to remove part of the conductive layer so that the remaining conductive layer forms a conductive plug 48. This completes the fabrication of a semiconductor device according to a preferred embodiment of the present invention.

Referring again to FIG. 6, which further illustrates a structural view of a semiconductor device according to a preferred embodiment of the present invention. As shown in FIG. 6, the semiconductor device includes a channel layer 14 on a substrate 12, a bottom gate 30 disposed on the channel layer 14, a source layer 18 and a drain layer 20 disposed adjacent to two sides of the bottom gate 30, a phase change layer 38 disposed on the bottom gate 30, and a top gate 42 disposed on the phase change layer 38. Preferably, the bottom gate 30 includes a gate electrode 28 disposed on the channel layer 14 and a work function layer 26 disposed between the gate electrode 28 and the channel layer 14.

The semiconductor device also includes a first dielectric layer 22 disposed on the source layer 18 and drain layer 20 and around the gate electrode 28, a second dielectric layer 32 disposed on the first dielectric layer 22 and surrounding the phase change layer 38, a gate layer or the aforementioned first gate layer 36 disposed between the phase change layer 38 and the second dielectric layer 32 and on top of the second dielectric layer 32, a third dielectric layer 44 disposed on the first gate layer 36 and around the top gate 42, and a conductive plug 48 disposed in the third dielectric layer 44 and connected to the top gate 42 directly.

Viewing from a more detailed perspective, the work function layer 26 is U-shaped, the top surface of the gate electrode 28 is even with the top surfaces of the work function layer 26 and first dielectric layer 22, the top surface of the first gate layer 36 is even with the top surface of the phase change layer 38, and the top surface of the top gate 42 is slightly higher than the top surfaces of the phase change layer 38 and first gate layer 36.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a channel layer on a substrate;
a bottom gate on the channel layer, wherein the bottom gate comprises a gate electrode and a work function layer between the gate electrode and the channel layer;
a source electrode layer and a drain electrode layer adjacent to two sides of the bottom gate;

a first dielectric layer on the source electrode layer and the drain electrode layer and the around the gate electrode, wherein the first dielectric layer contacts the work function layer directly;
a phase change layer on the bottom gate; and
a top gate on the phase change layer.

2. The semiconductor device of claim 1, wherein the work function layer is U-shaped.

3. The semiconductor device of claim 1, wherein top surfaces of the first dielectric layer, the work function layer, and the bottom gate electrode are coplanar.

4. The semiconductor device of claim 1, further comprising:
a second dielectric layer on the first dielectric layer and around the phase change layer; and
a gate layer between the phase change layer and the second dielectric layer and on the second dielectric layer.

5. The semiconductor device of claim 1, wherein the phase change layer is U-shaped.

6. The semiconductor device of claim 1, where in the phase change layer comprises germanium antimony telluride (GST) or germanium telluride (GeTe).

7. The semiconductor device of claim 4, wherein top surfaces of the gate layer and the phase change layer are coplanar.

8. The semiconductor device of claim 4, wherein a top surface of the top gate is higher than top surfaces of the phase change layer and the gate layer.

9. The semiconductor device of claim 4, further comprising a third dielectric layer on the gate layer and around the top gate.

* * * * *